US008389387B2

(12) United States Patent
Sutter et al.

(10) Patent No.: US 8,389,387 B2
(45) Date of Patent: Mar. 5, 2013

(54) SEGMENTED NANOWIRES DISPLAYING LOCALLY CONTROLLABLE PROPERTIES

(75) Inventors: Eli Anguelova Sutter, Westhampton Beach, NY (US); Peter Werner Sutter, Westhampton Beach, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 392 days.

(21) Appl. No.: 12/683,054

(22) Filed: Jan. 6, 2010

(65) Prior Publication Data
US 2010/0171096 A1 Jul. 8, 2010

Related U.S. Application Data

(60) Provisional application No. 61/142,710, filed on Jan. 6, 2009.

(51) Int. Cl.
*H01L 21/20* (2006.01)
*H01L 21/36* (2006.01)
(52) U.S. Cl. ............... 438/478; 257/E21.101; 977/762
(58) Field of Classification Search ............... 438/478; 977/762, 878, 891, 892; 257/E21.101, E21.09, 257/E21.114
See application file for complete search history.

(56) References Cited

U.S. PATENT DOCUMENTS

| 6,130,142 | A * | 10/2000 | Westwater et al. | 438/478 |
|---|---|---|---|---|
| 7,838,368 | B2 * | 11/2010 | Surdeanu et al. | 438/285 |
| 8,054,461 | B2 * | 11/2011 | Kuo et al. | 356/301 |
| 2005/0230356 | A1 * | 10/2005 | Empedocles et al. | 217/2 |
| 2007/0205792 | A1 * | 9/2007 | Mouli et al. | 324/765 |
| 2008/0266556 | A1 * | 10/2008 | Kamins et al. | 356/301 |
| 2010/0035412 | A1 * | 2/2010 | Samuelson et al. | 438/478 |
| 2010/0151661 | A1 * | 6/2010 | Samuelson et al. | 438/478 |

OTHER PUBLICATIONS

Arizumi, T., et al., "Etch patterns and dislocation etch pits on Germanium with $KI-I_2$ Redox system," *Japanese Journal of Applied Physics*, 1 (6), pp. 350-357 (1962).
Chiu, H. W., et al., "Thermal behavior and film formation from an Organogermanium polymer/nanoparticle precursor," *Langmuir*, 22 (12), pp. 5455-5458 (2006).
Cui, Y., et al., "Diameter-controlled synthesis of single-crystal silicon nanowires," *Applied Physics Letters*, 78 (15), pp. 2214-2216 (2001).
Delley, B., et al., "Size dependence of band gaps in silicon nanostructures," *Applied Physics Letters*, 67 (16), pp. 2370-2372 (1995).
Duan, X., et al., "General synthesis of compound semiconductor nanowires," *Advanced Materials*, 12 (4), pp. 298-302 (2000).
Duan, X., et al., "Indium phosphide nanowires as building blocks for nanoscale electronic and optoelectronic devices," *Nature*, 409 (6816), pp. 66-69 (2001) and 3 pages of online supplementary information.

(Continued)

*Primary Examiner* — Matthew Landau
*Assistant Examiner* — Latanya N Crawford
(74) *Attorney, Agent, or Firm* — Dorene M. Price

(57) ABSTRACT

Vapor-liquid-solid growth of nanowires is tailored to achieve complex one-dimensional material geometries using phase diagrams determined for nanoscale materials. Segmented one-dimensional nanowires having constant composition display locally variable electronic band structures that are determined by the diameter of the nanowires. The unique electrical and optical properties of the segmented nanowires are exploited to form electronic and optoelectronic devices. Using gold-germanium as a model system, in situ transmission electron microscopy establishes, for nanometer-sized Au—Ge alloy drops at the tips of Ge nanowires (NWs), the parts of the phase diagram that determine their temperature-dependent equilibrium composition. The nanoscale phase diagram is then used to determine the exchange of material between the NW and the drop. The phase diagram for the nanoscale drop deviates significantly from that of the bulk alloy.

8 Claims, 7 Drawing Sheets

OTHER PUBLICATIONS

Givargizov, E. I., "Fundamental aspects of VLS growth," *Journal of Crystal Growth*, 31 (20), pp. 20-30 (1975).

Goldstein, A. N., et al., "Melting in semiconductor nanocrystals," *Science*, 256 (5062), pp. 1425-1427 (1992).

Kamins, T. I., et al., "Growth and structure of chemically vapor deposited Ge nanowires on Si substrates," *Nano Letters*, 4 (3), pp. 503-506 (2004).

Kamins, T.I., et al., "Metal-catalysed, bridging nanowires as vapour sensors and concept for their use in a sensor system," *Nanotechnology*, 17 (11), pp. S291-S297 (2006).

Kodambaka, S. et al., "Germanium nanowire growth below the eutectic temperature," *Science*, 316 (5825), pp. 729-732 (2007) and 1 page of supporting material.

Lauhon, L. J., et al., "Epitaxial core-shell and core-multishell nanowire heterostructures," *Nature*, 420 (6911), pp. 57-61 (2002) and 3 pages of supporting information.

Lauhon, L.J., et al., "Semiconductor nanowire heterostructures," *Philosophical Transactions. Series A, Mathematical, physical and engineering sciences*, 362 (1319), pp. 1247-1260 (2004).

Lu, W., et al., "One-dimensional hole gas in germanium/silicon nanowire heterostructures," *Proceedings of the National Academy of Sciences of the United States of America*, 102 (29), pp. 10046 to 10051 (2005).

Peng, K., et al., "Aligned single-crystalline Si nanowire arrays for photovoltaic applications," *Small* 1(11), pp. 1062-1067 (2005).

Predel, B. in *Phase Equilibria, Crystallographic and Thermodynamic Data of Binary Alloys—Electronic materials and Semiconductors*, Landolt-Börnstein, Group IV: Physical Chemistry, vol. 5a, Ed. O. Madelung (Springer-Verlag, Berlin 1991), Ch. "Au-Ge" pp. 1-4, (DOI: 10.1007/10000866_279).

Sköld, N., et al., "Growth and optical properties of strained GaAs-$Ga_xIn_{1-x}P$ core-shell nanowires," *Nano Letters*, 5 (10), pp. 1943-1947 (2005).

Sun, X. H., et al., "Germanium nanowires: synthesis, morphology and local structure studies," *Nanotechnology*, 17 (12), pp. 2925-2930 (2006).

Sutter, E., et al., "Au-induced encapsulation of Ge nanowires in protective C shells," *Advanced Materials*, 18 (19), pp. 2583-2588 (2006).

Sutter, E., et al., "Phase diagram of nanoscale alloy particles used for vapor-liquid-solid growth of semiconductor nanowires," *Nano Letters*, 8 (2), 411-414 (2008) and 4 pages of supplemental material.

Sutter, E., et al., "Selective growth of Ge nanowires by low-temperature thermal evaporation," *Nanotechnology*, 19 (43), pp. 1-6 (2008).

Sutter, P., et al., "Dispensing and surface-induced crystallization of zeptolitre liquid metal-alloy drops," *Nature Materials*, 6 (5), pp. 363-366 (2007).

Tromp, R. M., et al., "Thermal adatoms on Si(001)," *Physical Review Letters*, 81 (5), pp. 1050-1053 (1998).

Vescan, L., et al., "Facet investigation in selective epitaxial growth of Si and SiGe on (001) Si for optoelectronic devices," *Journal of Vacuum Science Technology B*, 16 (3), pp. 1549-1554 (1998).

Wagner, R. S. et al., "Vapor-liquid-solid mechanism of single crystal growth," *Applied Physics Letters*, 4 (5), pp. 89-90 (1964).

Wautelet, M., "Estimation of the variation of the melting temperature with the size of small particles, on the basis of a surface-phonon instability model," *Journal of Physics D: Applied Physics*, 24 (3), pp. 343-346 (1991).

Wu, Y., et al., "Direct observation of vapor-liquid-solid nanowire growth," *Journal of the American Chemical Society*, 123 (13), pp. 3165-3166 (2001).

Wu, Y., et al., "Melting and welding semiconductor nanowires in nanotubes," *Advanced Materials*, 13 (7), pp. 520-523 (2001).

Wu, Y., et al., "Controlled growth and structures of molecular-scale silicon nanowires," *Nano Letters*, 4 (3), pp. 433-436 (2004).

Wu, Y., et al., "Single-crystal metallic nanowires and metal/semiconductor nanowire heterostructures," *Nature*, 430 (7000), pp. 61-65, 704 (2004).

Xia, Y., et al., "One-dimensional nanostructures synthesis, characterization and applications," *Advanced Materials*, 15 (5), pp. 353-389 (2003).

Yang, J.-E., et al., "Band-gap modulation in single-crystalline $Si_{1-x}Ge_x$ nanowires," *Nano Letters*, 6 (12), pp. 2679-2684 (2006) and 3 pages of supporting information.

Yang, J.-E., et al., "Band-gap modulation in single-crystalline $Si_{1-x}Ge_x$ nanowires," *Nano Letters*, 6 (12), pp. 2679-2684 (2006) and 4 pages of supporting information.

\* cited by examiner

Fig. 1A    Fig. 1B    Fig. 1C
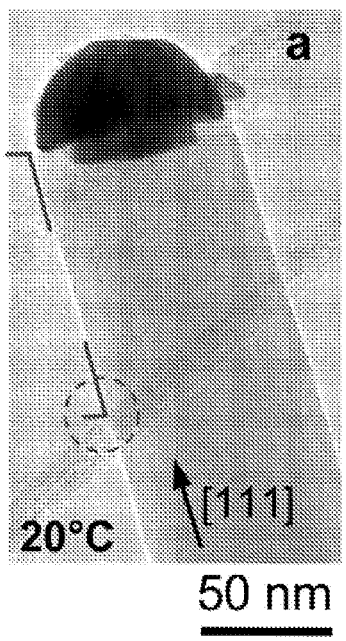
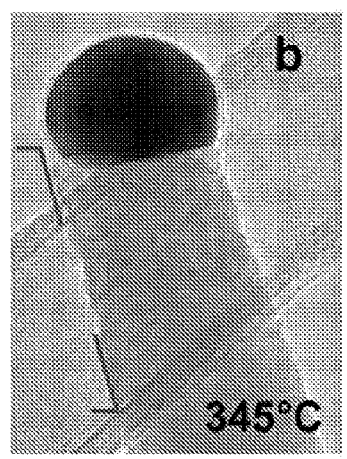
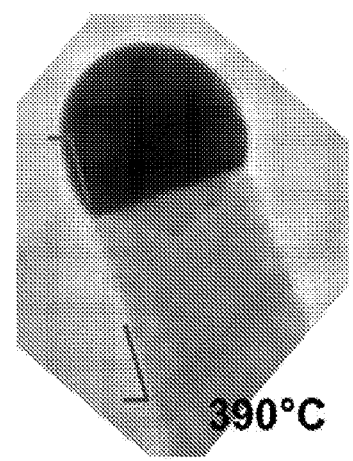
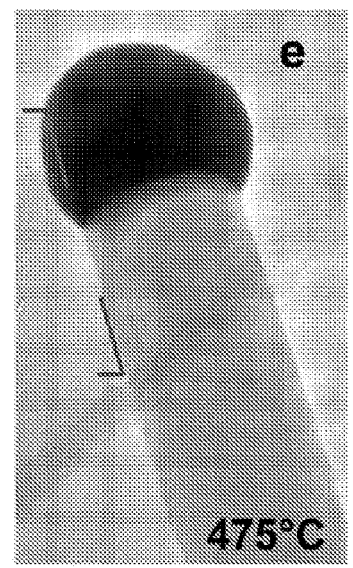
Fig. 1D    Fig. 1E Fig. 2A
Fig. 2B
Fig. 2C
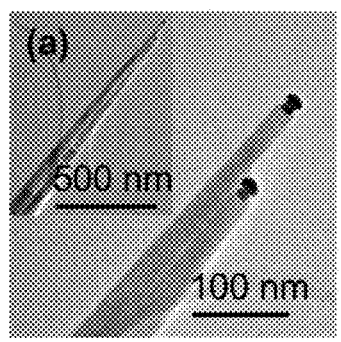 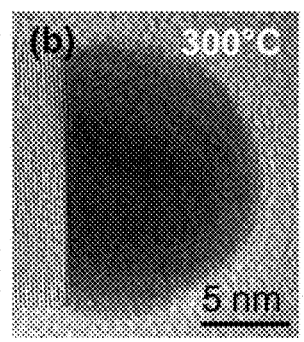 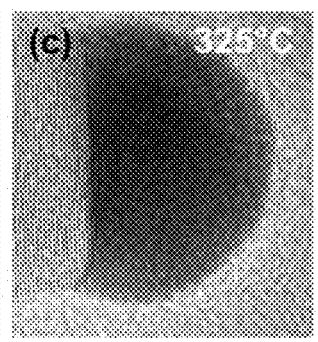
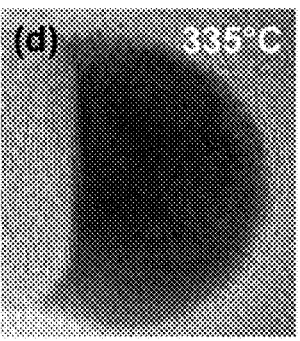 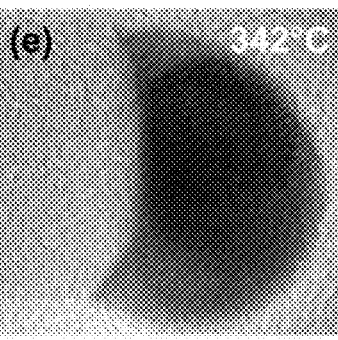 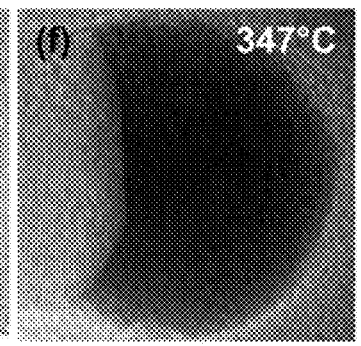
Fig. 2D
Fig. 2E
Fig. 2F

SEGMENTED NANOWIRES DISPLAYING LOCALLY CONTROLLABLE PROPERTIES

CROSS-REFERENCE TO RELATED APPLICATION

This application claims the benefit of U.S. Provisional Application No. 61/142,710, filed Jan. 6, 2009, which is incorporated herein by reference in its entirety.

The present invention was made with government support under contract No. DE-AC02-98CH10886 awarded by the U.S. Department of Energy. The United States government has certain rights in the invention.

BACKGROUND OF THE INVENTION

I. Field of the Invention

This invention relates generally to nanowire growth. In particular, the present invention relates to the synthesis of high-quality nanowires with site-specific dimensional control. This invention further relates to the utilization of such nanowires in characterization tools as well as in electronic and optical devices.

II. Background of the Related Art

The development of tools capable of analyzing, controlling, and forming materials on the nanoscale has led to an interest in creating new structures and devices at these dimensions. This ability to control matter on an atomic and molecular scale is the basis for the rapidly developing field of nanotechnology. As the size of a system continually decreases, its physical, optical, and electrical properties may differ significantly from, and even be superior to, those observed at the macroscale. These differences occur primarily due to quantum size effects and a significant increase in the surface-to-volume ratio as a consequence of the reduction to nanoscale dimensions. These changes strongly influence a number of materials properties which include the electronic, optical, mechanical, thermal, and chemical properties of the material itself.

From among the various nanomaterials that have emerged, zero- and one-dimensional nanostructures have attracted significant interest due to the potential for developing materials and devices with unique electrical and optical properties. Potential applications include quantum devices utilizing carrier confinement, photovoltaic cells, sensors, optical switches, and electronic devices such as field-effect transistors (FETs), p-n junctions, and bipolar junction transistors. One of the keys to the realization of practical applications utilizing these materials is the ability to form nanostructures with controlled dimensions, structures, and compositions. Such control would enable tailoring of the electrical, optical, and mechanical properties to a particular application. Another key aspect is the ability to form these nanostructures on a large scale at minimal cost.

The synthesis of zero-dimensional (0-D) nanostructures or quantum dots has been well-studied with a plurality of methods having been developed to form 0-D nanostructures in designated locations with well-controlled dimensions using a variety of materials. One-D nanostructures are often defined as structures with lateral dimensions falling within the range of 1 nm to 1 μm, but more usually to those in the range of 1 nm to 100 nm and longitudinal dimensions extending essentially indefinitely. Thus, while 0-D structures are generally discrete particles which are dimensionally symmetric, the formation of 1-D nanostructures requires that growth be constrained in two dimensions, yet extended along a third.

Top-down approaches which have been used to fabricate a variety of 1-D nanostructures from different materials include lithographic techniques such as electron-beam or focused-ion-beam etching, scanning probe patterning, and X-ray or extreme ultraviolet lithography. However, these techniques are not feasible for efficient large-scale manufacturing of 1-D nanostructures at low cost. Consequently significant effort has been focused on developing alternative methods to efficiently produce a large number of 1-D nanostructures from a wide range of materials. A majority of these have focused on bottom-up approaches in which 1-D growth strategies have been formulated based upon chemical synthesis routes. A review of these strategies is provided, for example, by Y. Xia in "*One-Dimensional Nanostructures: Synthesis, Characterization, and Applications*," Adv. Mater. 15, 353 (2003) the entire contents of which is incorporated by reference as if fully set forth in this specification.

Growth strategies which have been employed to form 1-D structures include, for example:
a) exploiting the anisotropic crystal structure of select materials;
b) using a liquid-solid interface to direct growth of a crystal;
c) forming a 1-D template to constrain growth to a specific direction;
d) controlling supersaturation of the gas phase to modify the growth mode;
e) use of capping reagents to kinetically control the growth rates on different crystal facets;
f) self-assembly of multiple 0-D nanostructures; and
g) direct size reduction of 1-D microstructures.

From among the various approaches followed, one of the most extensively investigated involves the vapor-phase synthesis of nanostructures such as 1-D whiskers, nanorods, and nanowires (NW).

Vapor-phase synthesis primarily involves manipulating the degree of supersaturation of the gas phase to control the growth mode. One approach, termed vapor-liquid-solid (VLS) growth, has been used to successfully produce high-quality single-crystal NWs in significant quantities. The VLS process was used by Wagner and coworkers in the 1960's to form Si "whiskers" as described in "*Vapor-Liquid-Solid Mechanism of Single Crystal Growth*," Appl. Phys. Lett. 4, 89 (1964), which is incorporated by reference herein in its entirety. Central to the VLS process is the use of a catalyst comprising a metal or metal alloy to direct NW growth; in the case of Wagner's Si whiskers the catalyst was a gold-silicon (Au—Si) alloy. The catalyst is initially dispersed across the surface of a substrate as suitably-sized nanoparticles which transform to the liquid alloy phase upon heating and supplying of semiconductor material. The liquid alloy nanoparticles absorb atoms from the vapor phase, facilitating the nucleation of crystal seeds at the liquid-substrate interface from which NW growth can occur. The material constituting the growing NW and the nanoparticle form a liquid-phase binary alloy drop whose interface with the growing wire represents the NW growth front. Under steady-state growth conditions, adsorption on the drop surface maintains a concentration gradient of the NW component of the liquid binary alloy, which is counteracted by a diffusion current through the drop. This liquid phase transport, in turn, causes a small supersaturation driving the incorporation of new material at the drop-NW interface to continually extend the wire. This growth process is described, for example, by E. I. Givargizov in "*Fundamental Aspects of VLS Growth*," J. Cryst. Growth 31, 20 (1975) which is incorporated by reference in its entirety as if fully set forth in this specification. Givargizov used Pd, Ni, and Pt, in addition to Au, as liquid-forming agents (growth catalysts) for Si.

The VLS process has now been used to synthesize NWs from a wide variety of inorganic materials including, for example, group IV (Si and Ge), IV-IV (SiC), III-V (GaN, GaAs, GaP, InP, and InAs), II-VI (ZnS, ZnSe, and CdSe), and IV-VI (PbSe, PbS) semiconductors as well as oxides such as ZnO, MgO, and $SiO_2$, This has been demonstrated, for example, by X. Duan, et al. in "*General Synthesis of Compound Semiconductor Nanowires*," Adv. Mater. 4, 298 (2000) and "*InP Nanowires as Building Blocks for Nanoscale Electronic and Optoelectronic Devices*," Nature 409, 66 (2001), as well as by T. I. Kamins, et al. in "*Growth and Structure of Chemically Vapor Deposited Ge Nanowires on Si Substrates*," Nano Lett. 4, 503 (2004) ("Kamins 2004"), each of which is incorporated by reference in its entirety as if fully set forth in this specification. Note that the VLS growth of compounds such as GaAs and GaP need not require the use of an exotic catalyst; they may instead be grown via the formation of a liquid in which one or the other element is enriched compared to the equilibrium solid composition.

Despite its widespread use, key aspects of the VLS growth process remain poorly understood. Consequently, little is known about how to control nanowire dimensions during growth. This is primarily due to the fact that, in contrast to studies on conventional thin film deposition, measurements with nanometer spatial resolution are needed to analyze the mechanisms of NW growth. While progress has been made, there remains a need to develop methods for fabricating a large number of high-quality nanowires with well-controlled dimensions, chemical compositions, surface morphologies, and nanostructures. It is therefore necessary to formulate strategies to control not only the nucleation, growth mode, average diameter, and length of individual nanowires, but also the local site-specific diameter during growth itself.

SUMMARY OF THE INVENTION

In view of the above-described problems, needs, and goals, some embodiments of the present invention provide a method of controlling the local position-dependent dimensions of a nanowire (NW) during vapor-liquid-solid (VLS) growth. Some embodiments of the present invention produce a NW with at least two sections along the length of the NW wherein the diameter changes abruptly between each section. In one embodiment, control of nanowire dimensions is accomplished by increasing the temperature. Increasing the temperature results in an increase in the solubility limit of a drop situated at a growth interface with the NW. This drives further incorporation of material either from the precursor or from the NW into the drop, thereby enlarging the drop. The enlarged drop eventually attains a size larger than the diameter of the NW.

In this embodiment, as the NW grows and the material crystallizes out of the drop, the nanowire expands radially outward from the center of the nanowire along the circumference of the enlarged drop, thereby increasing the diameter of the nanowire. In another embodiment the growth is stopped after the drop is enlarged and the system is annealed for a certain amount of time. NW growth may then be resumed by reintroducing the growth precursor. The change in nanowire diameter is abrupt on an atomic scale, occurring over a few lattice spacings of the material along the growth direction, yet maintains continuity of the crystal structure across the entire length of the wire.

In some embodiments, the diameter of the drop is controlled by the composition of a precursor material.

In another embodiment, a nanowire comprising a plurality of sections, each of which has a different diameter is formed by repeating the method, as described above, a plurality of times. In this manner, nanowires with complex geometries which exploit quantum size effects on different length scales within the same nanowire may be formed. The diameter of the nanowire ranges between 1 and 100 nm, with the length along the nanowire axis being a predetermined value. The diameter of a NW section may be larger or smaller than that of a preceding or subsequent section.

In some embodiments, a nanowire of uniform composition and having a plurality of segments is provided, the bandgap of the nanowire differing between segments. In some embodiments, the dopant concentration and/or type is changed abruptly between segments. This may be accomplished by changing the amount and/or identity of a dopant precursor in the gas phase. In some embodiments only the dopant type and/or concentration changes between segments of the NW; in others both the doping and diameter may change.

In yet another embodiment of the present invention a nanowire with two or more sections, each with differing diameters, is incorporated into an electronic device. The electronic device may be, for example, a sensor, photoelectronic device, transistor, electronic switch, or for impedance-matching of two or more delay lines.

These and other aspects of the present invention will become more apparent from the following description and illustrative embodiments which are described in detail with reference to the accompanying drawings. Similar elements in each figure are designated by like reference numbers and, hence, subsequent detailed descriptions thereof may be omitted for brevity.

BRIEF DESCRIPTION OF THE DRAWINGS

FIGS. 1A-1E are transmission electron microscopy (TEM) images showing a Au—Ge alloy nanoparticle at the tip of a Ge nanowire (NW), during in situ annealing at temperatures between room temperature and 475° C.

FIGS. 2A-2F show a sequence of TEM images which illustrate the process of melting of a Au—Ge nanoparticle during in situ annealing.

DETAILED DESCRIPTION OF THE INVENTION

Figure 3:
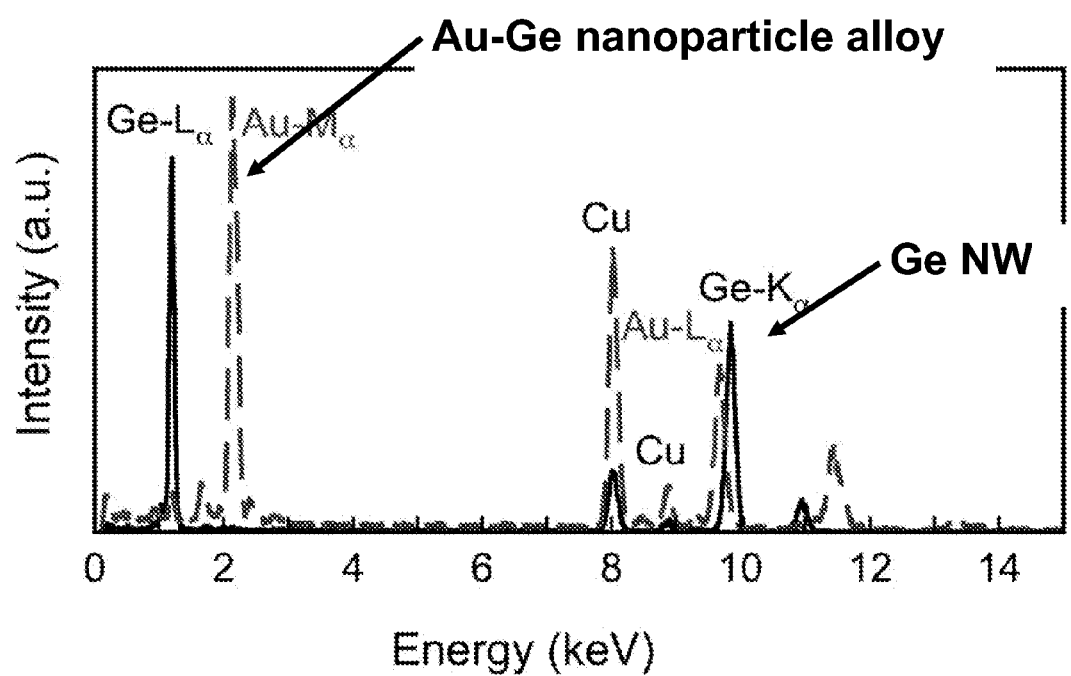
FIG. 3 shows room-temperature energy dispersive spectroscopy (EDS) data obtained from the Ge NW and a Au—Ge nanoparticle at the tip of a Ge NW.

In the interest of clarity, in describing the present invention, the following terms and acronyms are defined as provided below.

Definitions

Alloy: A partial or complete solid or liquid solution of two or more elements.
Bottom-Up Approach: A growth or manufacturing method wherein smaller components (usually on the atomic or molecular scale) are built up into more complex assemblies. This approach uses, for example, the chemical properties of molecules to cause them to self-assemble.
Eutectic Composition: In a binary alloy system, the composition that solidifies at the lowest temperature of any composition in the system.
Eutectic Reaction: A reaction in which, upon cooling below a eutectic temperature, a liquid phase transforms isothermally and reversibly into two intimately mixed solid phases.
Eutectic Temperature: In a binary alloy system, the lowest temperature at which any composition of the system solidifies.
ex situ: The opposite of in situ. This term is used, in the context of nanowire growth, to mean that a process or analysis is performed outside the growth or analytical chamber, after deposition is at least partially complete.
in situ: Latin for "in the place." Within the context of nanowire growth or analysis this means that a process or analysis is performed within the growth or analytical chamber. Measurements performed within the TEM before, during, or after annealing and without breaking vacuum are termed in situ.
Liquidus Line: In a binary phase diagram, the line or boundary separating liquid and liquid+solid phase regions. For a given alloy composition, the liquidus temperature is the temperature at which a solid phase first forms under conditions of equilibrium cooling.
Nanoparticle: Objects which are sized between 1 and 100 nm in all three dimensions.
Nanowire: A wire-like object having a diameter in the nanometer size range. The lateral size is generally constrained to within 1 to 100 nm in diameter whereas the longitudinal size is unconstrained.
Phase Diagram: A type of chart showing the relationship between environmental constraints such as temperature or pressure with the composition and regions of phase stability in a material. This is ordinarily shown under conditions of thermodynamic equilibrium.
Top-Down Approach: A growth or manufacturing method in which externally controlled tools are used to configure materials into the desired shape and order. This approach uses microfabrication techniques such as photolithography or inkjet printing.
ACRONYMS:
  CVD: Chemical Vapor Deposition
  EDS: Energy Dispersive X-ray Spectroscopy
  FET: Field-Effect Transistor
  HR-TEM: High-Resolution TEM
  NW: Nanowire
  TEM: Transmission Electron Microscopy
  UHV: Ultrahigh Vacuum
  VLS: Vapor-Liquid-Solid
  VSS: Vapor-Solid-Solid The present invention makes use of the inventors' discovery that the phase diagram of nanoscale alloy drops differs from the corresponding bulk phase diagram. The properties of the alloy drop at or close to thermodynamic equilibrium with the adjacent NW, represented by the phase diagram of the binary alloy, govern important aspects of VLS NW growth. A key parameter is the equilibrium composition of the binary alloy drop formed from the nanoparticle and the NW material as determined by the liquidus line in the nanoscale binary phase diagram. Changing the temperature of the drop results in a spontaneous adjustment to a new equilibrium composition by exchange of material with the adjacent solid NW. This leads to a well-defined adjustment of the drop size which, in turn, defines the diameter of the growing NW.

The drop size defines the diameter of the growing NW, a key characteristic that governs, via quantum confinement, the electronic and optical properties of the wire. The one-to-one relationship between drop size and wire diameter is used to control the overall diameter of the NW in general, and in some embodiments of this invention to control the local position-dependent diameter during growth. Constricted or dilated NW sections with a locally increased or decreased band gap may be produced along the length of a NW by adjusting the temperature to induce changes in the drop size. Thus, a major step toward forming such new wire geometries and attaining increased control over VLS growth lies in a determination of the nanoscale phase diagram of the binary alloy drop for the relevant temperature range.

I. Vapor-Liquid-Solid Growth

The ability to control nanowire dimensions on the local scale was discovered while analyzing nanostructural changes induced by annealing germanium (Ge) nanowires formed by VLS growth with gold (Au) nanoparticles. It is to be understood, however, that the use of the Ge—Au material system as described in this specification is merely exemplary, being described in detail to illustrate the principles of the invention. Control of the nanowire size by temperature-induced changes in the solubility of the alloy drop may be achieved with any material system in which nanowires may be grown by the VLS method. This includes group IV, III-V, and II-VI semiconductors, as well as a number of oxides forming the material of the nanowire in combination with the appropriate metal or metal alloy as the nanoparticle catalyst. It is to be understood that for the non-elemental NW compositions the alloy drop may comprise a binary, ternary, quaternary, or higher-degree alloy. In the case of line compounds of well-defined stoichiometry, such as the III-V and II-VI semiconductors, the alloy drop may be "pseudo-binary," with the catalyst material in equilibrium with the line compound, such as GaAs or CdS. When the catalyst-NW system is not strictly binary, "eutectic" should be understood to include "eutectoid."

The growth of Ge NWs by a VLS process with Au as the catalyst nanoparticle was done according to synthesis routes previously described, for example, by E. Sutter et al. in "*Selective Growth of Ge Nanowires by Low-Temperature Thermal Evaporation*", Nanotechnol. 19, 435607 (2008); Kamins 2004; Y. Wu, et al. in "*Direct Observation of Vapor-Liquid-Solid Nanowire Growth*," J. Am. Chem. Soc. 123, 3165 (2001); and X. H. Sun, et al. in "*Ge Nanowires: Synthesis, Morphology, and Local Structural Studies*," Nanotechnol. 17, 2925 (2006) ("Sun 2006"), each of which, along with the references cited therein, is incorporated by reference in its entirety as if fully set forth in this specification. Post-growth the synthesized NWs are dispersed on amorphous carbon films supported by standard copper grids for variable temperature transmission electron microscopy (TEM) investigations.

II. Nanostructure Characterization

TEM and high-resolution TEM (HR-TEM) were used to observe, in real time, the behavior of the Au—Ge alloy drops at the tips of the Ge NWs while annealing over the temperature range from room temperature (RT) to 500° C. Variable temperature in situ TEM analyses were carried out in a JEOL JEM 3000F field emission TEM equipped with a Gatan 652 high-temperature sample holder. The TEM is capable of attaining temperatures ranging from RT to 500° C. at pressures below $1.5 \times 10^{-7}$ Torr. The electron irradiation intensity was maintained below 2 A/cm$^2$ to minimize uncontrolled electron-beam induced structural changes.

Such in situ observations at temperatures typical for NW growth are a powerful approach to quantifying equilibrium properties of the NW growth front as well as the NW growth kinetics. In situ TEM analyses can also be used to explore conditions suitable for the synthesis of complex NW geometries and hetero structures. The results reveal a pronounced temperature-dependent exchange of Ge between the NW and the Au—Ge drop in which the wire acts as an efficient source or sink of Ge as the drop adjusts its composition to achieve its equilibrium Ge content. Although these experiments do not incorporate a growth flux or the small (~2%) supersaturation that drives actual NW growth, they do allow quantitative determination of important parts of the phase diagram of nanometer-sized Au—Ge VLS seed drops.

A. Nanoparticle Alloy Phase Transitions

FIGS. 1A-1E are bright-field TEM images of a typical Ge NW segment located close to the tip which follow the evolution of the nanoparticle and its interface with the wire during in situ heating from room temperature to 475° C. The electron beam was aligned with the [211] direction of the nanowire. These NWs exhibit a slight taper (see, e.g., FIG. 2A) from the base to the Au-rich alloy nanoparticle at the tip which is distinguished by its darker contrast. Other NWs do not exhibit a taper, but give the same experimental results. The NWs have mono crystalline cores, are aligned with the [111] direction, and are initially terminated by a thin oxide layer formed in the air during transfer from the growth chamber. Initial heating from room temperature (e.g., FIGS. 1A and 2A) to 300° C., where the particle is still solid, causes the desorption of the native oxide from the Ge surface. This can be seen from a comparison of FIGS. 1A and 1B, which respectively show the presence and absence of a thin oxide layer surrounding the Ge NW core. The formation and desorption of this oxide layer has been analyzed in detail by E. Sutter, et al. in "*Au-Induced Encapsulation of Ge Nanowires in Protective Carbon Shells,*" Adv. Mater. 18, 2583 (2006), which is incorporated by reference in its entirety as if fully set forth in this specification.

Melting of the Au—Ge alloy nanoparticle was analyzed as the temperature was increased from room temperature to the bulk eutectic temperature ($T_E$=368° C.) of the Au—Ge alloy. Representative images illustrating the melting process are shown in FIGS. 2A-2F. A bright-field TEM image of the structure and morphology of Ge NWs at room temperature is shown in FIG. 2A; this image was obtained prior to in situ annealing and is representative of the as-grown starting material of the present invention. The inset of FIG. 2A shows a low-magnification overview of two wires dispersed on the underlying amorphous carbon support. The wires have diameters between 10 nm and 70 nm. The tapering effect is irrelevant to the observed phenomena; untapered NWs have been used in similar experiments with identical results. FIG. 2B is a high-resolution image obtained close to the NW tip which shows lattice fringes with separation of ~0.33 nm along a direction parallel to the NW axis. This is consistent with the spacing of (111) planes in bulk Ge. Within the Au—Ge alloy, lattice fringes with a separation of 0.21 nm are resolved, close to the lattice spacing of (111) planes in Au. At room temperature the alloy particle is not a homogeneous hemisphere but appears more irregular, likely as a result of the Au/Ge phase separation during cooling of the NWs after synthesis.

Energy dispersive X-ray spectra (EDS) from the nanowire and the nanoparticle were collected in the TEM at room temperature and the results are shown in FIG. 3, with the Ge spectrum shown by the solid line and the Au spectrum dashed. The composition of the solid Au—Ge alloy was quantified from the EDS spectra using the integrated peak intensities (Ge—K, Au-L) and library element standards provided by the Thermo NORAN Vantage software package. The Cu peaks in both spectra in FIG. 3 arise due to the underlying Cu grid used to support the sample in the TEM. The EDS spectra show that the NW consists almost entirely of Ge (<1 at. % Au) while the Au nanoparticle contains very small amounts of Ge, less than 4 at. %, in agreement with similar observations reported by Sun, et al. (Sun 2006).

During in situ annealing, re-alloying of Au—Ge in the nanoparticle produces a hemispherical shape. FIG. 2B shows that at 300° C. both the Ge NW and the Au—Ge alloy are crystalline. The interface between them is sharp and flat but shows no epitaxial relationship. With further temperature increase, the Au—Ge alloy begins to pre-melt well below the bulk eutectic temperature. Pre-melting is accompanied by pronounced changes at the interface between the solid Ge NW and the Au—Ge alloy. At 325° C. a small amount of molten alloy is observed at the intersection between the {111} NW-tip interface and the surface (FIG. 2C). The molten area spreads as Ge from the NW is consumed. The melting front penetrates the NW until a {113} facet (a major stable facet of Ge in vacuum) is attained as shown by FIG. 2D. Simultaneously a liquid shell forms over the entire surface of the Au—Ge alloy (FIG. 2E), i.e., the alloy undergoes classical surface melting preceding the melting of the interior. FIG. 2F shows that the interior of this particular drop melted completely at 347° C.

The interface between the Ge NW and the liquid Au—Ge alloy drop is no longer a simple {111} facet (as in the solid state, FIG. 2B) but consists of segments of {111} and {113} facets (FIG. 2F). When the entire Au—Ge tip finally melts, a large amount of Ge is dissolved into the drop from the adjacent Ge NW, which is reflected by an abrupt increase of the volume of the Au—Ge drop. Measurements of the drop volume before and after this Ge enrichment give a final Ge content at the melting temperature of about 30 at. %. This is close to the eutectic Ge concentration of a bulk Au—Ge alloy if we assume that the initial NW tip after VLS synthesis consists mainly of Au. The eutectic composition in Au—Ge binary alloys is 28 at. % Ge as determined by B. Predel in *Phase Equilibria, Crystallographic and Thermodynamic Data of Binary Alloys—Electronic Materials and Semiconductors*, Landoll-Börnstein, Group IV: Physical Chemistry, Vol. 5a, Ed. O. Madelung (Springer-Verlag, Berlin 1991), Ch. "Au—Ge" pp. 1-4, (DOI: 10.1007/10000866_279) which is incorporated by reference as if fully set forth in this specification.

Final melting of the Au—Ge nanoparticles as the alloy achieves the (eutectic) composition with the lowest melting point by dissolving Ge from the NW is generally observed at a eutectic temperature $T_E=368°$ C. The volume change upon melting is accompanied by a simultaneous recession of the alloy-NW interface as the alloy absorbs the Ge required to reach the eutectic composition. A further increase of the temperature to 475° C. ($\gg T_E$) is accompanied by a continuous increase of the volume of the now-liquid alloy drop. Again, the interface between the alloy and the adjacent solid Ge NW draws back towards the base of the NW as Ge is incorporated into the drop. Between room temperature and 475° C. the drop/NW interface recedes by ~25-30 nm and transforms from a planar Ge (111) facet to a multifaceted interface composed of {113} and (111) segments. This is illustrated by FIGS. 1B-1E which show that increasing the sample temperature, $T_S$, from 345° C. to 475° C. produces a gradual increase in the volume of the drop with a concomitant recession of the drop-NW interface. The marker in FIGS. 1A-1E delineates the surface of the Ge NW and provides a reference for the $T_S$-dependent location of the interface.

B. Nanoscale Phase Diagram

Measurements of the drop volume were used to quantify the alloy composition as a function of temperature. The Ge (atomic) content $N_{Ge}$ was calculated from the volume of the eutectic drop V(T) using $$N_{Ge} = \frac{V(T) - N_{Au}v_{Au}}{v_{Ge}}$$

where $N_{Au}$ is the (constant) number of Au atoms in the drop and $v_{Au}$, $v_{Ge}$ denote the atomic volumes of the alloy components as determined from the densities of liquid Au ($\rho_{Au}=17.4\times10^3$ kg/m$^3$) and Ge ($\rho_{Ge}=5.49\times10^3$ kg/m$^3$), respectively. The calculations are performed under the assumption that the initial, solid particle at room temperature consists of pure Au (i.e., that all Ge is expelled by phase separation upon solidification). As previously noted, in situ EDS results show minimal amounts of Ge in the particle, evaluated to be less than 4 at. %. With this assumption, the composition of the liquid drop at the melting temperature is found to be very close (within ±2 at. %) to the bulk eutectic composition (28 at. % Ge).

Figure 4:
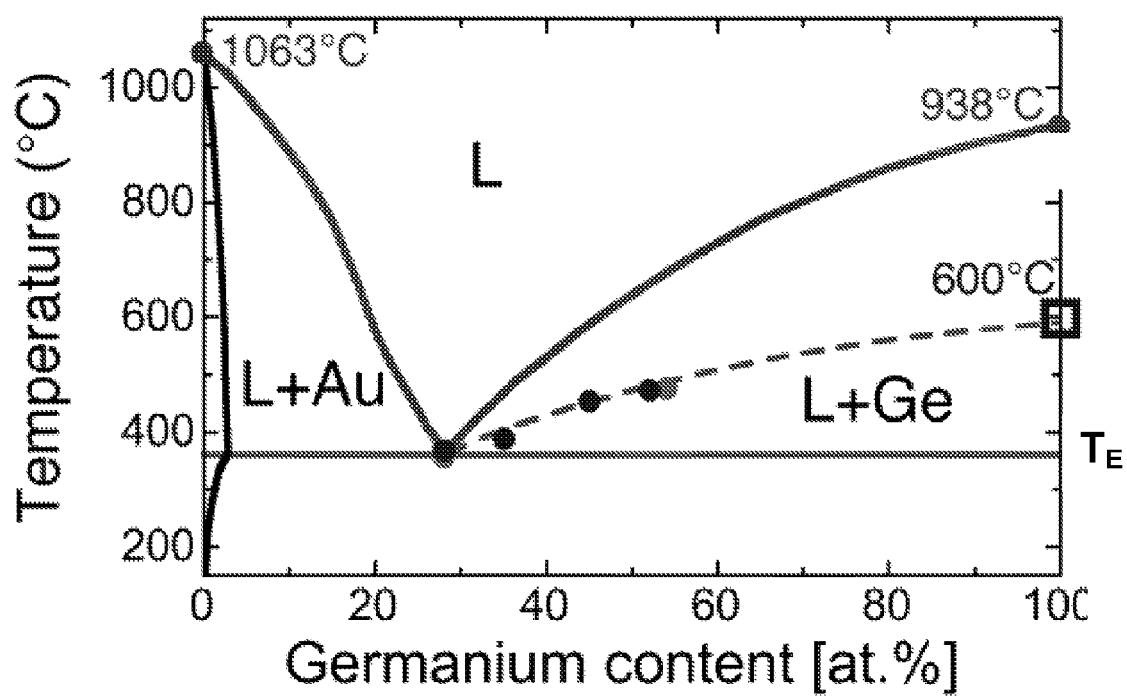
FIG. 4 is a Au—Ge binary alloy phase diagram with data on the temperature-dependent Ge content of two Au—Ge alloy nanoparticles at the tip of Ge NWs with radii of 10 and 30 inn which have been formed in accordance with the present invention.

At equilibrium, the atomic concentration of Ge in the alloy, $x(T)=N_{Ge}/(N_{Au}+N_{Ge})$, traces the liquidus of the nanoscale Au—Ge drop during VLS growth. A phase diagram for bulk Au—Ge binary alloys, which also includes the measured liquidus (dashed line) for NWs with diameters D of 60 nm (shown in FIG. 1) and 20 nm, is reproduced in FIG. 4. Experimental points are depicted as filled circles (●), while the melting temperature for a pure Ge nanoparticle calculated as explained below is depicted as an open square (□). In FIG. 4, L represents the Au+Ge liquid phase. While the eutectic temperatures ($T_E$) are very close to $T_{E,\infty}$ of the bulk alloy, the nanometer-sized drops have substantially higher Ge content than a bulk Au—Ge alloy at temperatures $T_S>T_E$. That is, for a given temperature above $T_E$, the liquidus line for the Au—Ge nanoparticle alloy is shifted to higher Ge concentrations. This means that the liquidus temperature for a given Ge concentration is depressed, resulting in a VLS seed drop with a Ge content and volume which is much larger than predicted by the bulk phase diagram. As the Ge content is continually increased, the lowered liquidus tends toward a significantly reduced melting temperature for a pure Ge nanoparticle. Large melting point depressions are often observed for nanoparticles as demonstrated, for example, by A. N. Goldstein, et al. in "Melting in Semiconductor Nanocrystals," Science, 256, 1425 (1992), which is incorporated by reference in its entirety as if fully set forth in this specification.

The size dependence of the melting temperature can be estimated using the well-established dependence $T_m=T_{m,\infty}[1-\alpha/d]$, for spherical particles with diameter d, where $T_{m,\infty}$ denotes the bulk melting temperature and $\alpha$ depends on the surface to volume ratio, and on the surface tensions of the liquid and solid as shown, for example, by M. Wautelet in "Estimation of the Variation of the Melting Temperature With the Size of Small Particles on the Basis of the Surface-Phonon Instability," J. Phys. D Appl. Phys. 24, 343 (1991), which is incorporated by reference in its entirety as if fully set forth in this specification. For Ge, the predicted melting temperatures fall between 530° C. and 800° C. for particles with diameter between 20 nm and 60 nm. Extrapolating the experimental points for the Ge NW liquidus, using the functional form of the bulk liquidus, to the melting temperature of a pure Ge nanoparticle gives $T_m\approx600°$ C., equivalent to the predicted $T_m$ of a nanoparticle with a 26-nm diameter and in excellent agreement with the observed melting temperature of a NW with a 20-nm diameter as determined by Y. Wu, et al. in "Melting and Welding of Semiconductor Nanowires in Nanotubes," Adv. Mater. 13, 520 (2001), which is incorporated by reference in its entirety as if fully set forth in this specification.

An immediate consequence of the liquidus suppression in the nanoscale Au—Ge phase diagram—important for VLS synthesis of Ge NWs—follows from the fact that the size of the alloy drop determines the wire diameter. While the bulk phase diagram predicts a negligible increase in drop size between $T_E$ and 500° C., the actual Au—Ge nanoparticle phase diagram implies a substantial size range in which the drop (and, hence, the wire) diameter may be adjusted by judicious changes in temperature. Formation of a nanoscale phase diagram has been described in detail by the inventors, E. Sutter, et al. in "Phase Diagram of Nanoscale Alloy Particles Used for Vapor-Liquid-Solid Growth of Semiconductor Nanowires," Nano. Lett. 8, 411 (2008), which, along with the references cited therein, is incorporated by reference in its entirety as if fully set forth in this specification.

C. Localized Control of Nanowire Dimensions

Figure 5:
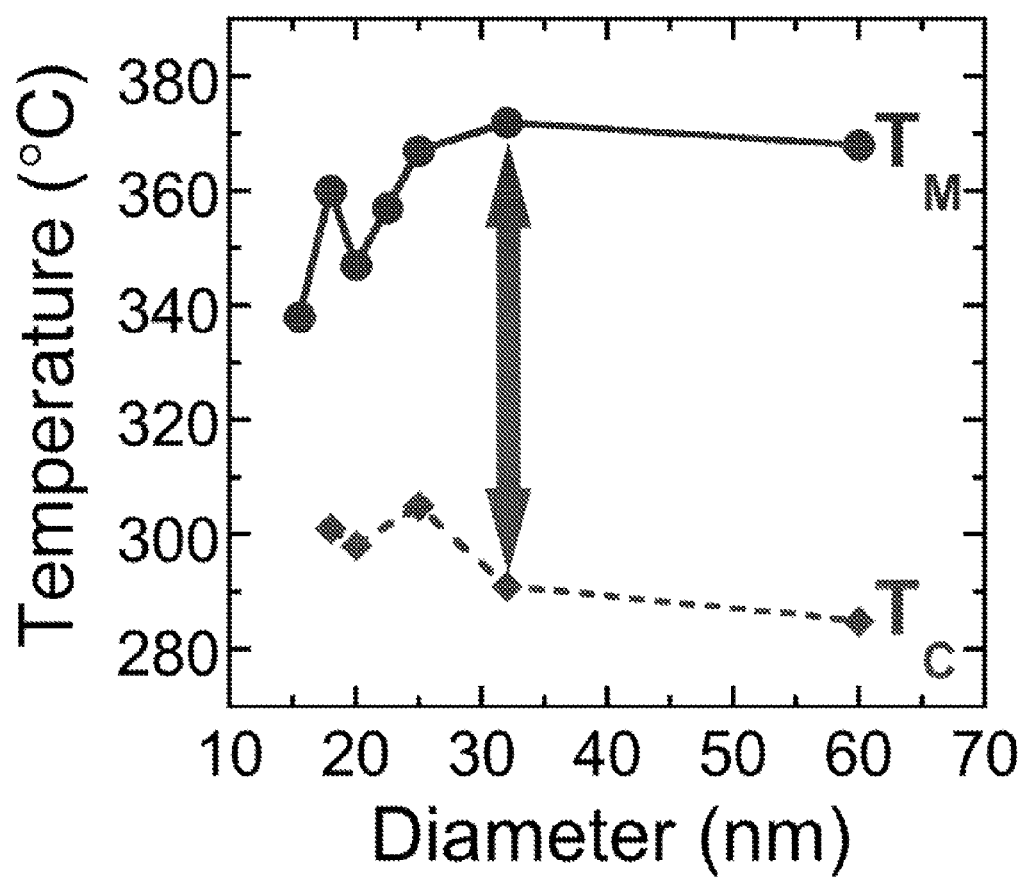
FIG. 5 shows the dependence of the melting and crystallization temperature of Au—Ge nanoparticles at the tip of Ge NWs as a function of the NW diameter.

Controlled expansion of the NW diameter by tuning the size of the Au—Ge drop was observed by high-temperature in situ TEM. In these experiments a large hysteresis between melting and crystallization temperatures (i.e., supercooling) of the alloy drops terminating the Au—Ge NWs is used. This is plotted in FIG. 5 which shows the dependence of the melting $T_M$ and crystallization $T_C$ temperatures on the size of the Au—Ge nanoparticle. For very small diameters, the melting point is depressed by about 20° C. while the observed crystallization temperature increases slightly. This indicates the possibility of a surface-induced crystallization process similar to that observed for free-standing Au—Ge drops as reported by P. Sutter, et al. in "Dispensing and Surface-Induced Crystallization of Zeptoliter Liquid Metal-Alloy Drops," Nat. Mater. 6, 363 (2007), which is incorporated by reference in its entirety as if set forth in this specification.

The difference between melting and crystallization provides a temperature window below $T_E$ in which a cooling drop remains liquid. The supercooled drop maintains its equilibrium composition by expelling Ge which then becomes incorporated in the Ge NW. This behavior allows the effective probing of the growth of a short NW section without driving the system out of equilibrium by an actual Ge flux onto the external surface of the alloy drop. The material is precipitated out of the drop by decreasing the temperature below Tc. As previously described with reference to FIGS. 1 and 2, annealing to $T_{max} \gg T_E$ enlarges the Au—Ge drop via Ge absorption from the NW to a diameter of 75 nm, 20% larger than the original wire diameter (~60 nm). When the temperature is lowered the NW re-grows, but with a new diameter ($d_{NW}$~75 nm) defined by the now-larger drop.

Figures 6A, 6B, 6C, 6D:
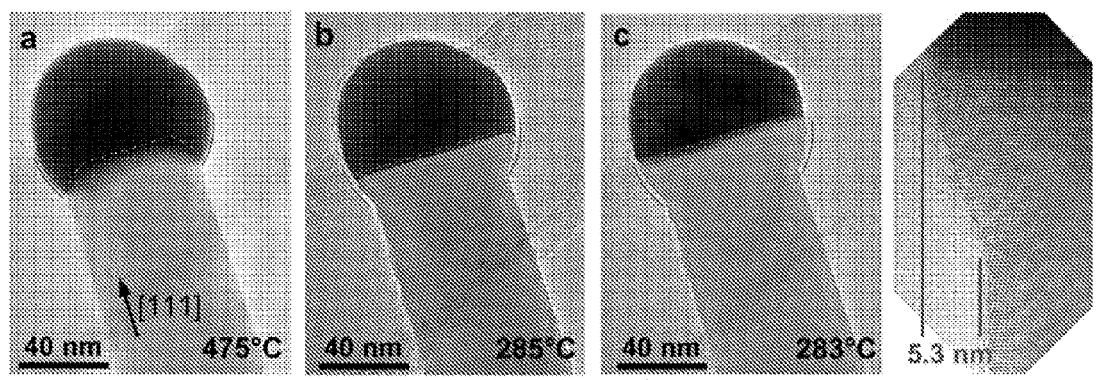
FIGS. 6A-6D are a sequence of TEM images showing a liquid Au—Ge alloy drop at the tip of a Ge NW formed according to the present invention at different temperatures during cooling from 475° C. to solidification.

Two modifications of the Ge-rich alloy drop at high temperature enable the expansion of the Ge wire: a substantial growth of the drop volume due to incorporation of Ge as evident from the phase diagram, and an adjustment of the Au—Ge/Ge interface. The solid-liquid interface reshapes from a planar Ge (111) facet to a multifaceted interface consisting of a central (111) plane surrounded by {113} facet segments at the periphery. This is illustrated by the dashed lines in FIG. 6A which indicate the projected shape of the interface between the Ge NW and the Au—Ge drop. The central dashed line which is perpendicular to the NW axis represents the (111) plane whereas the two angular lines at the periphery represent {113} facets. The net result is a significantly larger footprint of the Au—Ge drop perpendicular to the wire axis, a prerequisite for the growth of a thicker NW, which is initiated by lowering the temperature, or by changing the composition of the precursor vapor during those syntheses in which a precursor is present. Expansion of the NW diameter upon cooling from 475° C. to solidification at 283° C. is shown in FIGS. 6A-6C where the curved lines delineate the shape of the Au—Ge alloy drop at 475° C.

As the drop is cooled from 475° C. (FIG. 6A) to 285° C. (FIG. 6B), the drop reduces its Ge content by expelling Ge atoms to the NW. The shape of the newly grown NW section closely follows the original shape of the liquid alloy drop. Experiments on etching and growth have shown that {113} is a fast growing facet for Ge, while incorporation into the (111) plane is much slower. Hence, the initial wire growth from the cooling drop is accommodated almost entirely on the {113} facets, thus supporting the dilation of the NW diameter. Ge is not incorporated into the (111) interface plane until the {113} segments have been outgrown as shown by FIG. 6C which reveals a fully solidified drop at $T_S$=283° C. The material mediating the expansion of the NW diameter is shown, in FIG. 6D, to be perfectly crystalline Ge, without any observable defects. This Au—Ge nanoparticle and wire underwent a radial dilation of 5.3 nm upon solidification of the Ge NW.

The expansion of the NW diameter depends on the annealing-induced swelling of the VLS alloy drop and on the reshaping of the solid-liquid interface. Control experiments in which these effects were suppressed by limiting the maximum temperature to a few degrees above the melting point, i.e., $T_{max} \approx T_E$, resulted again in NW re-growth due to the melting-crystallization hysteresis, but with the original, smaller wire diameter.

III. Exemplary Embodiment

The in situ experimental results presented in this specification demonstrate that consideration of the actual phase diagram of a nanoscale VLS seed drop can be used to judiciously tailor the geometry of a growing NW. A junction where the NW diameter increases over a section of few nanometers is achieved by controlled expansion of the Au—Ge drop, following the liquidus of the nano-drop phase diagram. In practice, this entails absorption of additional semiconductor from the precursor or the NW into the alloy drop to expand to a new, larger wire diameter. This may be accomplished by increasing the temperature with or without an interruption of the growth, and/or annealing at higher temperatures. Further VLS NW growth under the new conditions will maintain the larger diameter of the wire. Experimental results show that even moderate annealing temperatures above the eutectic point provide a substantial potential for tailoring the NW geometry whereas a negligible effect would be predicted by the bulk phase diagram.

Figure 7:
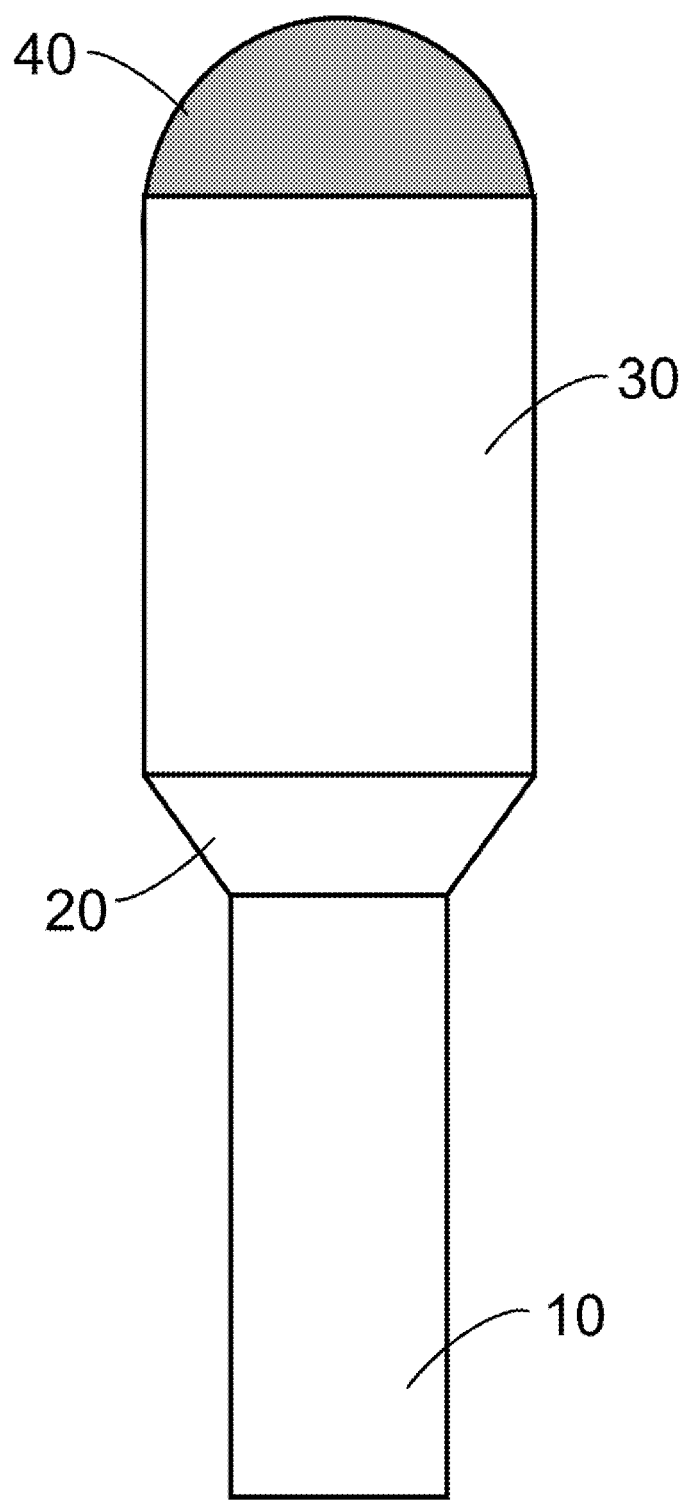
FIG. 7 is a schematic illustration of the cross-section of an exemplary NW formed according to the present invention whose diameter has been locally modified by manipulation of Ge supersaturation in the Au—Ge drop.

FIG. 7 is a schematic illustration of an exemplary nanostructure made in accordance with the present invention. The first nanowire segment 10 exhibits a taper 20 that is abrupt on an atomic scale, occurring over the length of a few lattice constants of the nanowire material. A second nanowire segment 30 results from an increase in the volume of the seed droplet 40. As the process of increasing the volume of the seed droplet is repeated, several segments of the nanowire, each having a different diameter, may be fabricated. In certain circumstances, no segment need have a constant diameter, but the taper 20 may be extended indefinitely to provide a nanowire of smoothly increasing diameter.

It is to be understood that localized control of the NW diameter according to the present invention as described in this specification is not limited to VLS growth of Ge nanowires via a Au nanoparticle. Such site-specific control may be attained in any other suitable material system, including other group IV, III-V, II-VI semiconductors and oxides as previously indicated above. Nanoparticles other than Au, e.g., any metal or metal alloy, may be used to form a suitable binary or higher-degree alloy in which the nanoscale phase diagram exhibits a liquidus line wherein the concentration of the NW material in the drop changes appreciably with temperature. The observed solubility change need only be of sufficient magnitude such that the drop size increases by incorporation of NW material in an amount on par with the required increase in NW diameter.

The present invention also is not limited to the structure illustrated in FIG. 7, but also extends to more complex geometries. For example, the NW diameter may be increased a plurality of times in succession to produce a cone-like structure in which the diameter increases or decreases sequentially from one segment to the next. The diameter of a segment may be greater or smaller than that of the preceding or subsequent adjacent segment. The changes in diameter also are not limited to a single nanowire, but may be simultaneously applied to a plurality of nanowires arrayed on a substrate by controlling the temperature of the entire surface.

The change in geometry may be accompanied by a change in doping of the nanowire. For example, when the nanowire diameter is increased by incorporation of growth precursor at higher temperature, the simultaneous introduction of dopant precursor will result in doping of the enlarged section of the nanowire. Of course, doping type and/or concentration may be changed abruptly or continuously along the NW at locations other than segment interfaces.

IV. Electronic Devices

Since quantum size effects and surface processes are associated with the size of the particle and the ratio of atoms at the surface to those in the bulk volume, control of material properties influenced by these two factors may be imparted by localized dimensional control of NW diameters. Consequently, a plurality of electronic devices which exploit this property may be fabricated. (See, for example, an enumeration supra.)

The abrupt change in nanowire diameter between segments results in an abrupt change in the bandgap of the nanowire at the segment interface. This creates an electronic junction between the segments, located at the physical interface. Such a junction mimics, for example, a Si—Ge or GaAs—InAs heterojunction wherein the wider bandgap (narrower diameter) NW segment is analogous to the Si or GaAs material, and the smaller bandgap (larger diameter) NW segment is analogous to the Ge or InAs material. It will be appreciated by those in the art that any electronic device or structure that depends on the discontinuity of bandgaps at heterojunctions can in principle be made using the segmented NWs of the present invention. Furthermore, a three-segment NW in which the first and third segments have a higher bandgap than the intervening second segment mimics a quantum well structure in which carriers are confined to the smaller-bandgap segment at equilibrium. In addition, combinations of geometry and doping profile can be used to create complex structures and devices using the methods described herein.

It will be appreciated by persons skilled in the art that the present invention is not limited to what has been particularly shown and described hereinabove. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent.

The invention claimed is:

1. A method of controlling the diameter of a nanowire during VLS growth, the method comprising:
   growing a first nanowire segment with a first width by the VLS method;
   enlarging a drop situated at a growth interface with the first nanowire segment by incorporating material into the drop such that the diameter of the drop becomes greater than the diameter of the first nanowire segment; and
   continuing growth of the nanowire with a second segment having a second width approximately equal to the diameter of the enlarged drop.

2. The method of claim 1 further comprising interrupting the nanowire growth before enlarging the drop.

3. The method of claim 1 wherein the drop is enlarged by incorporation of additional material from a growth precursor.

4. The method of claim 3 wherein a dopant precursor is incorporated into the drop.

5. A method of controlling the diameter of a nanowire during VLS growth, the method comprising:
   growing a first nanowire segment with a first width by the VLS method;
   enlarging a drop situated at a growth interface with the first nanowire segment by incorporating material into the drop such that the diameter of the drop becomes greater than the diameter of the first nanowire segment; and
   continuing growth of the nanowire with a second segment having a second width approximately equal to the diameter of the enlarged drop,
   wherein the drop is enlarged by incorporation of additional material from the nanowire.

6. A method of controlling the diameter of a nanowire during VLS growth, the method comprising:
   growing a first nanowire segment with a first width by the VLS method;
   enlarging a drop situated at a growth interface with the first nanowire segment by incorporating material into the drop such that the diameter of the drop becomes greater than the diameter of the first nanowire segment; and
   continuing growth of the nanowire with a second segment having a second width approximately equal to the diameter of the enlarged drop,
   wherein the drop is enlarged by increasing the temperature higher than $T_E$.

7. The method of claim 1 wherein material is precipitated out of the drop by decreasing the temperature below Tc.

8. A method of controlling the diameter of a nanowire during VLS growth, the method comprising:
   growing a first nanowire segment with a first width by the VLS method;
   enlarging a drop situated at a growth interface with the first nanowire segment by incorporating material into the drop such that the diameter of the drop becomes greater than the diameter of the first nanowire segment; and
   continuing growth of the nanowire with a second segment having a second width approximately equal to the diameter of the enlarged drop,
   wherein material is precipitated out of the drop by continuing nanowire growth at a temperature higher than the temperature used to grow said first nanowire segment.

* * * * *